(12) United States Patent
Achtenberg et al.

(10) Patent No.: US 9,959,168 B2
(45) Date of Patent: May 1, 2018

(54) ECC AND RAID-TYPE DECODING

(71) Applicant: SANDISK TECHNOLOGIES LLC, Plano, TX (US)

(72) Inventors: Stella Achtenberg, Netanya (IL); Eran Sharon, Rishon Lezion (IL); Idan Alrod, Herzliya (IL)

(73) Assignee: SanDisk Technologies LLC, Plano, TX (US)

( * ) Notice: Subject to any disclaimer, the term of this patent is extended or adjusted under 35 U.S.C. 154(b) by 1 day.

(21) Appl. No.: 15/177,822

(22) Filed: Jun. 9, 2016

(65) Prior Publication Data
US 2017/0255517 A1 Sep. 7, 2017

Related U.S. Application Data

(60) Provisional application No. 62/303,844, filed on Mar. 4, 2016.

(51) Int. Cl.
| | |
|---|---|
| *H03M 13/27* | (2006.01) |
| *G06F 11/10* | (2006.01) |
| *G06F 3/06* | (2006.01) |
| *H03M 13/11* | (2006.01) |
| *H03M 13/15* | (2006.01) |

(52) U.S. Cl.
CPC .......... *G06F 11/1076* (2013.01); *G06F 3/064* (2013.01); *G06F 3/0619* (2013.01); *G06F 3/0644* (2013.01); *G06F 3/0689* (2013.01); *H03M 13/1102* (2013.01); *H03M 13/1515* (2013.01)

(58) Field of Classification Search
CPC .................................................. G06F 11/1076
USPC .................... 714/764, 773, 763, 37, 6.13
See application file for complete search history.

(56) References Cited

U.S. PATENT DOCUMENTS

| | | | |
|---|---|---|---|
| 5,111,463 A * | 5/1992 | Zook | G11B 20/1809 360/48 |
| 5,751,733 A | 5/1998 | Glover | |
| 5,844,919 A | 12/1998 | Glover et al. | |
| 7,823,043 B2 | 10/2010 | Lasser | |
| 8,375,274 B1 | 2/2013 | Bonke | |
| 8,484,533 B2 | 7/2013 | Olbrich et al. | |
| 8,788,910 B1 | 7/2014 | Northcott | |
| 9,268,635 B2 | 2/2016 | Sharon et al. | |
| 9,354,975 B2 * | 5/2016 | Aliev | H03M 13/15 |

(Continued)

*Primary Examiner* — Fritz Alphonse
(74) *Attorney, Agent, or Firm* — Toler Law Group, PC (57) ABSTRACT

A device includes a memory and a controller. The controller is configured to read codewords of a data structure from the memory. The codewords include a number of undecodable codewords that are undecodable at an error correction coding (ECC) decoder according to a first correction scheme. The controller includes a stripe generator and a stripe decoder. The stripe generator is configured, in response to the number of undecodable codewords exceeding an erasure correction capacity of a stripe correction scheme, to generate trial data for a stripe of the data structure, the trial data including at least one element that corresponds to erased data and at least another element that is associated with an undecodable codeword and that corresponds to valid data of the stripe. The stripe decoder is configured to initiate a stripe decode operation of the trial data.

20 Claims, 4 Drawing Sheets

(56) References Cited

U.S. PATENT DOCUMENTS

| | | | |
|---|---|---|---|
| 2003/0070042 A1* | 4/2003 | Byrd | G06F 11/1076 |
| | | | 711/114 |
| 2007/0214316 A1 | 9/2007 | Kim | |
| 2012/0221926 A1 | 8/2012 | Blaum et al. | |
| 2013/0042053 A1 | 2/2013 | Huang | |
| 2015/0046767 A1 | 2/2015 | Cideciyan et al. | |
| 2015/0143027 A1 | 5/2015 | Luo et al. | |
| 2015/0205668 A1 | 7/2015 | Sundaram et al. | |
| 2015/0339187 A1 | 11/2015 | Sharon et al. | |
| 2016/0373137 A1* | 12/2016 | Zhang | H03M 13/05 |

* cited by examiner

ECC AND RAID-TYPE DECODING

CROSS-REFERENCE TO RELATED APPLICATIONS

The present application claims benefit of U.S. Provisional Application No. 62/303,844, filed Mar. 4, 2016, which is incorporated by reference herein in its entirety.

FIELD OF THE DISCLOSURE

This disclosure is generally related to data storage devices and more particularly to data encoding and recovery using error correction coding (ECC) techniques and redundant array of independent disks (RAID)-type techniques.

BACKGROUND

Non-volatile data storage devices, such as flash solid state drive (SSD) memory devices or removable storage cards, have allowed for increased portability of data and software applications. Flash memory devices can enhance data storage density by storing multiple bits in each flash memory cell. For example, Multi-Level Cell (MLC) flash memory devices provide increased storage density by storing 2 bits per cell, 3 bits per cell, 4 bits per cell, or more. Although increasing the number of bits per cell and reducing device feature dimensions may increase a storage density of a memory device, a bit error rate of data stored at the memory device may also increase.

Error correction coding (ECC) is often used to correct errors that occur in data read from a memory device. Prior to storage, data may be encoded by an ECC encoder to generate redundant information (e.g., "parity bits") that may be stored with the data as an ECC codeword. As more parity bits are used, an error correction capacity of the ECC increases and a number of bits required to store the encoded data also increases. Using a sufficient number of parity bits to provide "worst-case" error correction capability for all data stored in a memory device reduces the storage density of the memory device in order to protect against an amount of data corruption that is statistically unlikely to occur before the memory device reaches the end of its useful life.

SSD devices may also incorporate a redundant array of independent dies (RAID)-type storage scheme that may use parity bits to enable data recovery in case of memory defects and device failures, which cannot be recovered by the ECC which is aimed at handling random errors (e.g., due to program disturb, read disturb, charge loss due to data retention, etc.). ECC may not be able to recover the data in case of memory defects or complete failure, which may result in very high error rates that exceed the ECC capability. Hence, additional RAID-type protection may be required for protecting against such memory defects. For example, a RAID 6 storage scheme may distribute data, a first parity for the data, and a second parity for the data in a "stripe" across multiple non-volatile memories (e.g., across multiple SSDs or across multiple NAND flash memories in a single SSD). The first parity (or the second parity) may enable recovery of the data in the stripe in case of erasures due to failure of one of the data-storing non-volatile memories, and the first parity and the second parity together may enable recovery of the data in the stripe in case of erasures due to failure of two of the data-storing non-volatile memories. However, data in such storage schemes may not be recoverable if three or more of the data-storing non-volatile memories fail. Note that although the name RAID may suggest that RAID parity is stored in a redundant die, this is not mandatory. In some cases, a redundant plane, redundant block or redundant word lines (WLs) or pages within a block may be used for storing the RAID parity. For example, the RAID stripe may be implemented across dies, planes, blocks or pages within a block of the non-volatile memory.

The two protection levels, ECC for random errors and RAID for memory defects and failures, may require memory overprovisioning for storing the ECC and RAID parity.

DETAILED DESCRIPTION

A data storage device is configured to perform error correction code (ECC) and RAID-type decoding. Memory overprovisioning may be used for storing the ECC and RAID parity to provide the two protection levels: ECC for random errors and RAID for memory defects and failures. In order to efficiently utilize the allocated overprovisioning and to improve or maximize the random error correction capability given the overall allocated overprovisioning, joint ECC and RAID decoding can be performed, leveraging the unused RAID overprovisioning for random error correction, whenever there are no memory defects or when the number memory defects is less than the RAID correction capability.

The data storage device may include a controller coupled to a memory. The memory may store a data structure including a plurality of codewords. The data structure may also include parity codewords. Each of the codewords may be stored at separate pages of the memory. The data structure may be configured to enable each of the codewords to be decodable independently of the other codewords. Portions of the codewords may correspond to multiple stripes of the data structure. For example, first portions of the codewords may correspond to a first stripe of the data structure and second portions of the codewords may correspond to a second stripe of the data structure.

The controller may read the codewords from the memory. The codewords may include a number of undecodable codewords that are undecodable at an ECC decoder according to a first correction scheme (e.g., a low-density parity check (LDPC) scheme). The ECC decoder may generate trial data for a stripe of the data structure such that at least one of the undecodable codewords corresponds to erased data of the stripe and at least another of the undecodable codewords corresponds to valid data of the stripe. The ECC decoder may initiate a stripe decode operation of the trial data using a stripe correction scheme. The ECC decoder may, for each undecoded stripe of the data structure, test different combinations of the undecodable codewords as erased data until the stripe is decoded or until all distinct combinations of the undecodable codewords as erased data have been tested.

Particular examples in accordance with the disclosure are described below with reference to the drawings. In the description, common features are designated by common reference numbers. As used herein, "exemplary" may indicate an example, an implementation, and/or an aspect, and should not be construed as limiting or as indicating a preference or a preferred implementation. Further, it is to be appreciated that certain ordinal terms (e.g., "first" or "second") may be provided for identification and ease of reference and do not necessarily imply physical characteristics or ordering. Therefore, as used herein, an ordinal term (e.g., "first," "second," "third," etc.) used to modify an element, such as a structure, a component, an operation, etc., does not necessarily indicate priority or order of the element with respect to another element, but rather distinguishes the element from another element having a same name (but for use of the ordinal term). In addition, as used herein, indefinite articles ("a" and "an") may indicate "one or more" rather than "one." As used herein, a structure or operation that "comprises" or "includes" an element may include one or more other elements not explicitly recited. Further, an operation performed "based on" a condition or event may also be performed based on one or more other conditions or events not explicitly recited.

Figure 1:
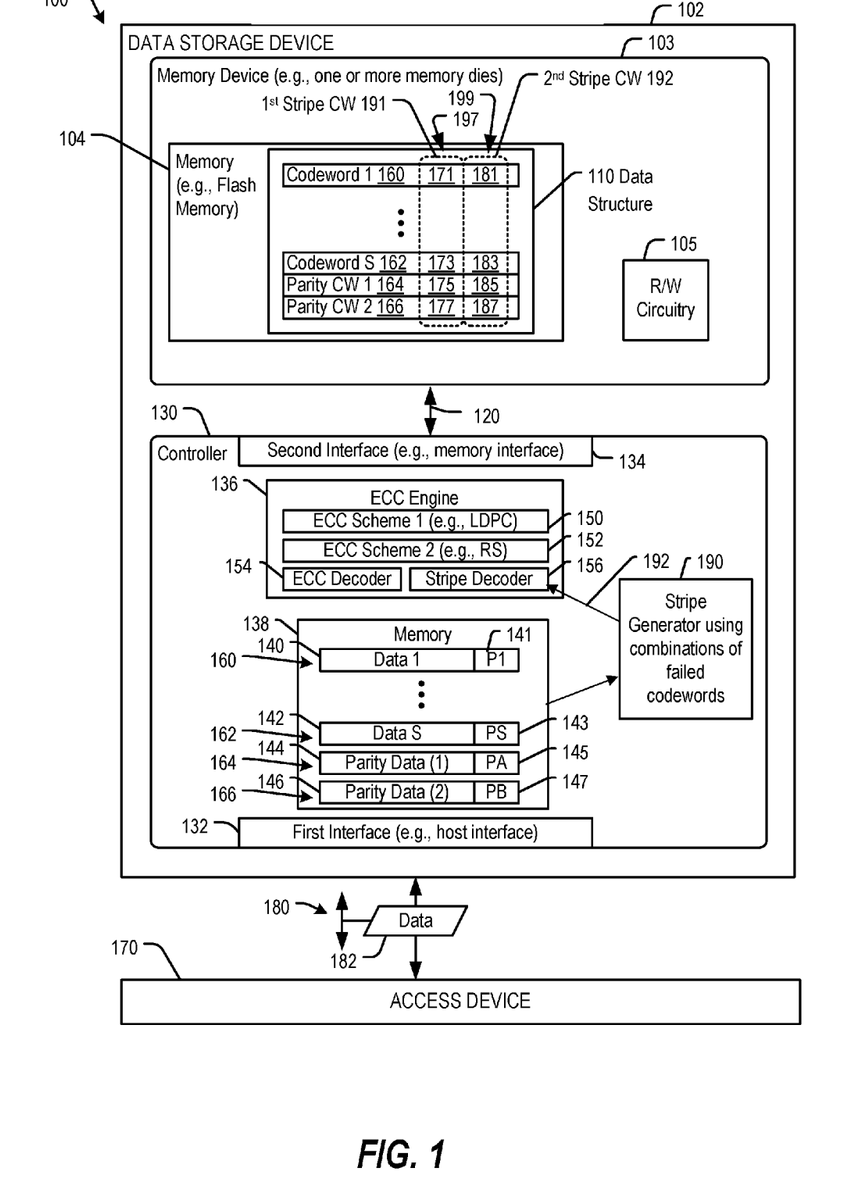
FIG. 1 is a block diagram of an illustrative example of a system including a data storage device including an ECC engine configured to decode data using ECC techniques and RAID-type techniques.

FIG. 1 depicts an illustrative example of a system 100 that includes a data storage device 102 and an access device 170 (e.g., a host device or another device). The data storage device 102 includes an ECC engine 136 that is configured to encode stripes of a data structure 110 and to decode data of the data structure 110 according to a first correction scheme 150 (e.g., a LDPC correction scheme) and a second correction scheme 152 (e.g., a stripe correction scheme). If a number of rows (e.g., LDPC codewords) of the data structure 110 that are uncorrectable using the first correction scheme 150 exceeds an erasure correction capability of the stripe correction scheme 152, multiple trials of stripe decoding may be performed for each stripe of the data structure 110 by selecting different combinations of the uncorrectable rows as representing erased data of the stripe or as representing valid data of the stripe. As a result, one or more stripes of the data structure 110 may be decoded even though the erasure correction capacity is exceeded.

The data storage device 102 and the access device 170 may be coupled via a connection (e.g., a communication path 180), such as a bus or a wireless connection. The data storage device 102 may include a first interface 132 (e.g., an access device or host interface) that enables communication via the communication path 180 between the data storage device 102 and the access device 170.

The data storage device 102 may include or correspond to a solid state drive (SSD) which may be included in, or distinct from (and accessible to), the access device 170. For example, the data storage device 102 may include or correspond to an SSD, which may be used as an embedded storage drive (e.g., a mobile embedded storage drive), an enterprise storage drive (ESD), a client storage device, or a cloud storage drive, as illustrative, non-limiting examples. In some implementations, the data storage device 102 is coupled to the access device 170 indirectly, e.g., via a network. For example, the network may include a data center storage system network, an enterprise storage system network, a storage area network, a cloud storage network, a local area network (LAN), a wide area network (WAN), the Internet, and/or another network. In some implementations, the data storage device 102 may be a network-attached storage (NAS) device or a component (e.g., a solid-state drive (SSD) device) of a data center storage system, an enterprise storage system, or a storage area network.

In some implementations, the data storage device 102 may be embedded within the access device 170, such as in accordance with a Joint Electron Devices Engineering Council (JEDEC) Solid State Technology Association Universal Flash Storage (UFS) configuration. For example, the data storage device 102 may be configured to be coupled to the access device 170 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). Alternatively, the data storage device 102 may be removable from the access device 170 (i.e., "removably" coupled to the access device 170). As an example, the data storage device 102 may be removably coupled to the access device 170 in accordance with a removable universal serial bus (USB) configuration.

The data storage device 102 may operate in compliance with an industry specification. For example, the data storage device 102 may include a SSD and may be configured to communicate with the access device 170 using a small computer system interface (SCSI)-type protocol, such as a serial attached SCSI (SAS) protocol. As other examples, the data storage device 102 may be configured to communicate with the access device 170 using a NVM Express (NVMe) protocol or a serial advanced technology attachment (SATA) protocol. In other examples, the data storage device 102 may operate in compliance with a JEDEC eMMC specification, a JEDEC Universal Flash Storage (UFS) specification, one or more other specifications, or a combination thereof, and may be configured to communicate using one or more protocols, such as an eMMC protocol, a universal flash storage (UFS) protocol, a universal serial bus (USB) protocol, and/or another protocol, as illustrative, non-limiting examples.

The access device 170 may include a memory interface (not shown) and may be configured to communicate with the data storage device 102 via the memory interface to read data from and write data to the memory device 103 of the data storage device 102. For example, the access device 170 may be configured to communicate with the data storage device 102 using a SAS, SATA, or NVMe protocol. As other examples, the access device 170 may operate in compliance with a Joint Electron Devices Engineering Council (JEDEC) industry specification, such as a Universal Flash Storage (UFS) Access Controller Interface specification. The access device 170 may communicate with the memory device 103 in accordance with any other suitable communication protocol.

The access device 170 may include a processor and a memory. The memory may be configured to store data and/or instructions that may be executable by the processor. The memory may be a single memory or may include multiple memories, such as one or more non-volatile memories, one or more volatile memories, or a combination thereof. The access device 170 may issue one or more commands to the data storage device 102, such as one or more requests to erase data, read data from, or write data to the memory device 103 of the data storage device 102. For example, the access device 170 may be configured to provide data, such as data 182, to be stored at the memory device 103 or to request data to be read from the memory device 103. The access device 170 may include a mobile telephone, a computer (e.g., a laptop, a tablet, or a notebook computer), a music player, a video player, a gaming device or console, an electronic book reader, a personal digital assistant (PDA), a portable navigation device, a computer, such as a laptop computer or notebook computer, a network computer, a server, any other electronic device, or any combination thereof, as illustrative, non-limiting examples.

The memory device 103 of the data storage device 102 may include one or more memory dies (e.g., one memory die, two memory dies, eight memory dies, or another number of memory dies). The memory device 103 includes a memory 104, such as a non-volatile memory of storage elements included in a memory die of the memory device 103. For example, the memory 104 may include a flash memory, such as a NAND flash memory, or a resistive memory, such as a resistive random access memory (ReRAM), as illustrative, non-limiting examples. In some implementations, the memory 104 may include or correspond to a memory die of the memory device 103. The memory 104 may have a three-dimensional (3D) memory configuration. As an example, the memory 104 may have a 3D vertical bit line (VBL) configuration. In a particular implementation, the memory 104 is a non-volatile memory having a 3D memory configuration that is monolithically formed in one or more physical levels of arrays of memory cells having an active area disposed above a silicon substrate. Alternatively, the memory 104 may have another configuration, such as a two-dimensional (2D) memory configuration or a non-monolithic 3D memory configuration (e.g., a stacked die 3D memory configuration).

Although the data storage device 102 is illustrated as including the memory device 103, in other implementations the data storage device 102 may include multiple memory devices that may be configured in a similar manner as described with respect to the memory device 103. For example, the data storage device 102 may include multiple memory devices, each memory device including one or more packages of memory dies, each package of memory dies including one or more memories such as the memory 104. Data striping and error recovery as described with respect to pages of the memory 104 may be extended to include data striping and error recovery across multiple dies, across multiple packages, across multiple memory devices, or any combination thereof.

The memory 104 may include one or more blocks, such as a NAND flash erase group of storage elements. Each storage element of the memory 104 may be programmable to a state (e.g., a threshold voltage in a flash configuration or a resistive state in a resistive memory configuration) that indicates one or more values. Each block of the memory 104 may include one or more word lines. Each word line may include one or more pages, such as one or more physical pages. In some implementations, each page may be configured to store a codeword. A word line may be configurable to operate as a single-level-cell (SLC) word line, as a multi-level-cell (MLC) word line, or as a tri-level-cell (TLC) word line, as illustrative, non-limiting examples.

The memory device 103 may include support circuitry, such as read/write circuitry 105, to support operation of one or more memory dies of the memory device 103. Although depicted as a single component, the read/write circuitry 105 may be divided into separate components of the memory device 103, such as read circuitry and write circuitry. The read/write circuitry 105 may be external to the one or more dies of the memory device 103. Alternatively, one or more individual memory dies of the memory device 103 may include corresponding read/write circuitry that is operable to read data from and/or write data to storage elements within the individual memory die independent of any other read and/or write operations at any of the other memory dies.

The memory 104 includes the data structure 110. The data structure 110 includes multiple codewords (e.g., "S" codewords, where S is an integer greater than one), such as a first codeword 160 and one or more additional codewords, including an $S^{th}$ codeword 162. The data structure 110 also includes a first parity codeword 164 on a first page and a second parity codeword 166 on a second page of the memory 104. For example, each of the codewords 160-166 may be stored at separate pages of the memory 104. The data structure 110 is configured to enable each of the codewords 160-166 to be decodable independently of the other codewords 160-166. For example, the first codeword 160 includes parity bits that may be used by the ECC engine 136 to correct bit errors up to the correction capability of the first correction scheme 150. In the event that one or more of the codewords 160-162 contain a number of bit errors that exceeds the correction capability of the first correction scheme 150, one or more of the first parity codeword 164 and the second parity codeword 166 may be used to generate error-corrected data corresponding to one or more stripes of the data structure 110, such as a first stripe codeword 191 corresponding to a first stripe 197 and a second stripe codeword 192 corresponding to a $K^{th}$ stripe 199, where K indicates a number of stripes in the data structure 110 and is an integer greater than one.

To illustrate, the first stripe codeword 191 includes a first portion 171 of the first codeword 160 and a first portion of one or more of the other codewords, including a first portion 173 of the $S^{th}$ codeword 162. The first portions 171-173 of the codewords 160-162 may be encoded using a stripe encoding scheme (e.g., a Reed-Solomon (RS)) scheme) to generate first parity data corresponding to the first stripe 197. A first portion 175 of the first parity data corresponding to the first stripe 197 is included in the first parity codeword 164 and a second portion 177 of the first parity data corresponding to the first stripe 197 is included in the second parity codeword 166. The second stripe codeword 192 includes a second portion 181 of the first codeword 160 and a second portion of one or more other codewords of the data structure 110, including a second portion 183 of the $S^{th}$ codeword 162. The second stripe codeword 192 also includes a first portion 185 of second parity data corresponding to the $K^{th}$ stripe 199 and a second portion 187 of the second parity data that corresponds to the $K^{th}$ stripe 199.

The controller 130 is coupled to the memory device 103 via a bus 120, an interface (e.g., interface circuitry, such as a second interface 134), another structure, or a combination thereof. For example, the bus 120 may include one or more channels to enable the controller 130 to communicate with a single memory die of the memory device. As another example, the bus 120 may include multiple distinct channels to enable the controller 130 to communicate with each memory die of the memory device 103 in parallel with, and independently of, communication with other memory dies of the memory device 103.

The controller 130 is configured to receive data and instructions from the access device 170 and to send data to the access device 170. For example, the controller 130 may send data to the access device 170 via the first interface 132, and the controller 130 may receive data from the access device 170 via the first interface 132. The controller 130 is configured to send data and commands to the memory 104 and to receive data from the memory 104. For example, the controller 130 is configured to send data and a write command to cause the memory 104 to store data to a specified address of the memory 104. The write command may specify a physical address of a portion of the memory 104 (e.g., a physical address of a word line of the memory 104) that is to store the data. The controller 130 may also be configured to send data and commands to the memory 104 associated with background scanning operations, garbage collection operations, and/or wear leveling operations, etc., as illustrative, non-limiting examples. The controller 130 is configured to send a read command to the memory 104 to access data from a specified address of the memory 104. The read command may specify the physical address of a portion of the memory 104 (e.g., a physical address of a word line of the memory 104).

The ECC engine 136 is configured to receive data to be stored to the memory 104 and to generate a codeword. For example, the ECC engine 136 may include an encoder configured to encode data using an ECC scheme, such as a Reed Solomon encoder, a Bose-Chaudhuri-Hocquenghem (BCH) encoder, a low-density parity check (LDPC) encoder, a Turbo Code encoder, an encoder configured to encode one or more other ECC encoding schemes, or any combination thereof. The ECC engine 136 may include one or more decoders configured to decode data read from the memory 104 to detect and correct, up to an error correction capability of the ECC scheme, any bit errors that may be present in the data.

For example, the ECC engine 136 may include a first decoder, such as an ECC decoder 154, to decode codewords (e.g., codewords 160-166) according to the first correction scheme 150. The ECC engine 136 may include a second decoder, such as a stripe decoder 156, to correct erasures in the stripe codewords of the data structure 110 (e.g., stripe codewords 191-192) according to the second correction scheme 152. As a non-limiting example, each of the codewords 160-166 may be encoded using a first encoding scheme (e.g., LDPC), each of the stripes 190-192 may be encoded using a second encoding scheme (e.g., Reed Solomon), the first correction scheme 150 may include a LDPC correction scheme, and the second correction scheme 152 may include a Reed Solomon erasure correction scheme. Although LDPC and Reed Solomon are provided as non-limiting examples, each of the codewords 160-166 may be encoded using a different encoding scheme (e.g., a BCH scheme), and each of the stripes 190-192 may be encoded using a different stripe encoding scheme (e.g., another BCH scheme).

The controller 130 is configured to receive the data 182 from the access device 170 and to encode the data 182 into multiple codewords and multiple stripe codewords to generate the data structure 110 to be stored in the memory 104. For example, the controller 130 may be configured to partition the data 182 into S data words. To illustrate, first data 140 may correspond to a first data word of the data 182 and $S^{th}$ data 142 may correspond to a last data word of the data 182. The controller 130 is configured to encode first data 140 to generate a first codeword 160 that is decodable using the first correction scheme 150. To illustrate, the first codeword 160 may include the first data 140 and first parity bits (P1) 141 based on the first data 140. The controller 130 is further configured to encode second data 142 (e.g., the $S^{th}$ data) to generate the second codeword 162 (e.g., the $S^{th}$ codeword). The second codeword 162 includes the second data 142 and also includes second parity bits (e.g., "PS" parity bits for the $S^{th}$ data) 143 based on the second data 142. Although FIG. 1 illustrates two data words 140 and 142 and two codewords 160 and 162, it should be understood that any number of data words and codewords may be used to generate the data structure 110. For example, S may have a value of 2, 3, 4, 16, 32, 128, or any other integer value greater than one.

The first codeword 160 and the second codeword 162 may be stored in a memory 138 (e.g., a random access memory (RAM) within the controller 130 or RAM (e.g., double data rate type 3 (DDR3) synchronous dynamic RAM (SDRAM)) that is coupled to the controller 130) to enable ECC processing on one or more stripes of the data 140-142 to generate stripe parity data. The controller 130 may be configured to cause the ECC engine 136 to encode multiple stripes of data (e.g., stripes 1 to K (or 0 to K−1), corresponding to multiple columns of multiple bits) from each of the S codewords 160-162 to be encoded using the composite generator function 156 to generate parity bits for each stripe 197-199. The parity bits for each stripe 197-199 are inserted into a first set of parity data 144 and a second set of parity data 146 at locations corresponding to the respective stripes. For example, the controller 130 is configured to generate first parity data that corresponds to the first stripe codeword 191 by encoding the first portions 171-173 of the codewords 160-162. The controller 130 is further configured to store the first portion 175 of the first parity data corresponding to the first stripe 197 in a first page of the memory 104 and to store the second portion 177 of the first parity data in the second page of the memory 104. Although FIG. 1 illustrates two stripes 197 and 199, it should be understood that any number of stripes may be used. For example, K may have a value of 2, 3, 4, 16, 32, 128, or any other integer value greater than one.

The ECC engine 136 may encode each stripe until the sets of parity data for each stripe have been generated and stored in the memory 138. The ECC engine 136 is configured to encode the first sets of parity data 144 to generate the first parity codeword 164 that includes the first set of parity data 144 and parity bits (PA) 145. The ECC engine 136 is further configured to encode the second set of parity data 146 to generate the second parity codeword 166 that includes the second set of parity data 146 and parity bits (PB) 147.

The controller 130 may be configured to transfer the codewords 160-166 from the memory 138 for storage into the memory 104 of the memory device 103 to form the data structure 110 in the memory 104. For example, the controller 130 may be configured to sequentially write the codewords 160-166 to consecutively-addressed pages of the memory 104 so that the data structure 110 is aligned in a row-and-column format as depicted in FIG. 1, with the codewords 160-166 forming rows and the stripes 197-199 forming columns in the memory 104. However, in other implementations, the codewords 160-166 may not have any particular alignment or physical relationship to each other in the memory 104, and locations of each of the codewords 160-166 of the data structure 110 may be tracked and maintained by the controller 130. For example, the controller 130 may include a table (not shown) that indicates the physical addresses of each of the S codewords 160-162 and the parity codewords 164-166. The controller 130 may populate the table when the data structure 110 is stored to the memory 104 and may update the table if any of the codewords 160-166 change physical addresses, such as due to garbage collection, wear leveling, or one or more other maintenance operations. The controller 130 may access the table to retrieve physical addresses of the codewords 160-166 in response to one or more of the codewords 160-162 being undecodable using the first correction scheme 150.

Bit errors occurring in one or more of the codewords 160-162 read from the memory 104 may exceed an error correction capacity of the ECC decoder 154. As described in further detail with respect to FIG. 2, the ECC engine 136 may read the remaining codewords of the data structure 110 from the memory 104 to the memory 138 and may attempt decoding of the remaining codewords at the ECC decoder 154. If a number of failed codewords (e.g., that are undecodable at the ECC decoder 154 due to too many errors) is less than or equal to an erasure correction capability of the stripe decoder 156, then the stripe decoder 156 may be used to correct each stripe, thereby correcting the failed codewords. However, if the number of failed codewords exceeds the erasure correction capability of the stripe decoder 156, then the stripe generator 190 may be used to generate one or more trial versions 192 of one or more of the stripes by selecting different combinations of the failed codewords as corresponding to either valid data or erased data, as explained in further detail with reference to FIGS. 2-3.

Because the data structure 110 includes the sets of stripe parity bits generated by the ECC engine 136, and because the stripe generator 190 may be used to perform stripe correction that exceeds an erasure capability of the stripe decoder 156, additional error correction capability is provided for the codewords 160-162 beyond the error correction capability provided by the codeword parity (e.g., parity P1 141 and P2 143). The codewords 160-162 may therefore be formed using fewer parity bits than would otherwise be required for "worst-case" error handling, reducing power consumption during decoding of the codewords 160-162.

Figure 2:
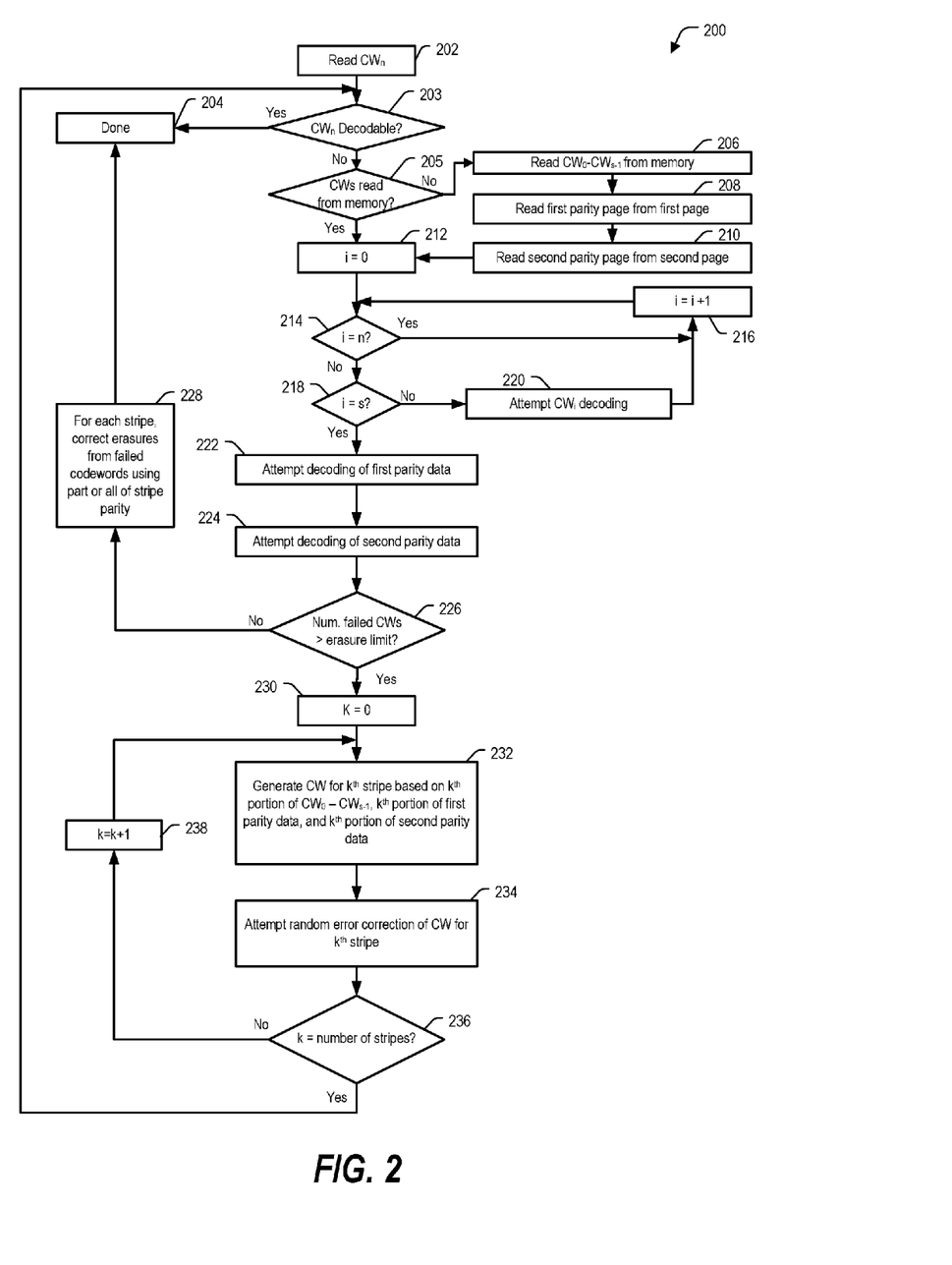
FIG. 2 is a flow diagram of a particular example of a method of decoding data that may be performed by the data storage device of FIG. 1.

Referring to FIG. 2, a particular implementation of a method 200 that may be performed by the controller 130 of the data storage device 102 of FIG. 1 is depicted. Although the method 200 is described with reference to the data storage device 102 of FIG. 1, in other implementations the method 200 may be performed by a device other than the data storage device 102 of FIG. 1.

The method 200 may be used in response to a request to read a particular codeword, $CW_n$. The method 200 includes reading $CW_n$ from the memory 104, at 202. For example, $CW_n$ may correspond to the first codeword 160 of FIG. 1. A determination may be made, at 203, as to whether $CW_n$ is decodable. For example, the controller 130 may route the representation of the first codeword 160 that is read from the memory 104 to the ECC engine 136 to initiate decoding according to the first correction scheme 150. In response to detecting that the $CW_n$ is decodable, an error corrected version of the data of $CW_n$ may be provided to the requestor, such as the access device 170 of FIG. 1, and the method 200 may end, at 204.

In response to determining that $CW_n$ is not decodable, a determination may be made whether the remaining codewords of the data structure 110 have been read from the memory 104, at 205. If the remaining codewords have been read from the memory, a loop counter "i" is initialized (e.g., i=0), at 212. Otherwise, if the remaining codewords of the data structure 110 have not been read from the memory 104, the remaining codewords of the data structure 110 may be read from the memory 104, at 206. The remaining codewords are designated as codewords $CW_0$-$CW_{S-1}$, where S indicates the number of non-parity codewords in the data structure 110. The codewords that are read from the memory 104 may be stored at a memory of the controller 130, such as the memory 138, for access by the ECC engine 136 during decode operations. Alternatively, one or more of the codewords may be retrieved from the memory 104 on an as-needed basis, such as if the memory 138 does not have sufficient capacity to store all of the codewords $CW_0$-$CW_{S-1}$. A first parity page (e.g., the first parity codeword 164 of FIG. 1) may be read from a first page of the memory 104, such as a flash memory, at 208, and a second parity page, such as the second parity codeword 166 of FIG. 1, may be read from a second page of the memory 104, at 210. Processing continues with setting the loop counter "i" to the initial value (e.g., 0), at 212.

A determination is made whether i=n, at 214. If i=n, then i is incremented, at 216. In response to determining that i is not equal to n, at 214, a determination is made whether i is equal to S, at 218. In response to determining that i is not equal to S, at 218, the controller 130 may attempt to decode the $i^{th}$ codeword ($CW_i$), at 220. For example, attempting to decode $CW_i$ may include determining whether $CW_i$ has been decoded, and if $CW_i$ has not been decoded, providing a representation of the $i^{th}$ codeword to the ECC engine 136 to perform a decode operation according to the first correction scheme 150. After attempting to decode $CW_i$, i is incremented, at 216.

When i=S, at 218, a decoding operation has been attempted for each of the (non-parity) codewords of the data structure 110. The controller 130 then attempts decoding of the first parity data, at 222. For example, if the first parity codeword 164 has not been decoded, the controller 130 may provide the first parity codeword 164 that is read from the memory 104 to the ECC engine 136 to attempt to decode the first parity codeword 164. The controller 130 also attempts decoding of the second parity data, at 224. For example, if the second parity codeword 166 has not been decoded, the controller 130 may provide the representation of the second parity codeword 166 that is read from the memory 104 to the ECC engine 136. The ECC engine 136 attempts a decoding operation to detect and correct errors in the second parity codeword 166 according to the first correction scheme 150.

After decode processing of each of the undecoded codewords 160-166 of the data structure 110, a number of undecoded codewords of the codewords $CW_1$-$CW_S$, the first parity data codeword, and the second parity data codeword is compared to an erasure correction capacity of the second correction scheme 152 of FIG. 1, at 226. In response to the number of undecoded codewords not exceeding the erasure correction capacity, each stripe is processed to correct erasures from the undecoded codewords using a portion or all of the stripe parity for the stripe, at 228. For example, if a single codeword (e.g., the first codeword 160 of FIG. 1) is undecoded, the first portion 175 or the second portion 177 of the stripe parity for the first stripe codeword 191 of FIG. 1 may be used to determine the first portion 171 of the first codeword 160. After erasure correction of each stripe, the error corrected version of the data of $CW_n$ may be provided to the requestor, such as the access device 170 of FIG. 1, and the method 200 may end, at 204.

Otherwise, if the number of undecoded codewords exceeds the erasure correction capacity, at 226, one or more trial codewords for each stripe may be generated using combinations of the failed codewords as erasure data and are processed using second correction scheme 154 to perform random error correction in a stripe-by-stripe, row-by-row iterative decoding process. To illustrate, another loop counter "k" is initialized to an initial value, e.g., k=0, at 230. The loop counter k may indicate a stripe index of stripes of the data structure 110. For example, the first stripe 197 may correspond to k=0, the second stripe 199 may correspond to k=1, etc. If the $k^{th}$ stripe is decodable using the stripe decoder 156 (e.g., if the stripe decoder 156 can correct up to Z erasures or Z/2 errors in a stripe, and the $k^{th}$ stripe has Z/2 or fewer errors), then the errors in the $k^{th}$ stripe are corrected by the stripe decoder 156. Otherwise, one or more trial codewords for the $k^{th}$ stripe may be generated based on the $k^{th}$ portion of each of the codewords $CW_0$-$CW_{S-1}$, the $k^{th}$ portion of the first parity data, and the $k^{th}$ portion of the second parity data, using different combinations of the failed codewords as erased data, at 232.

To illustrate, if the number of failed codewords is three (e.g., $CW_1$, $CW_s$, and Parity $CW_1$), and the erasure correction capability is two, three trial versions of the first stripe codeword 191 of FIG. 1 may be generated for the first stripe 197 based on the first portions of each of the codewords 160-162 and the first portion 175 and the second portion 177 of the first parity data. In trial data corresponding to a first trial stripe codeword, the first portion of $CW_1$ may be included as valid data but the first portion of $CW_s$ and Parity $CW_1$ may be omitted or designated as erased data. In trial data corresponding to a second trial stripe codeword, the first portion of $CW_s$ may be included as valid data but the first portion of $CW_1$ and Parity $CW_1$ may be omitted or designated as erased data. In trial data corresponding to a third trial stripe codeword, the first portion of Parity $CW_1$ may be included as valid data but the first portion of $CW_1$ and $CW_s$ may be omitted or designated as erased data. Thus, multiple trial stripe codewords generated using different combinations of the failed codewords taken Z at a time, where Z is the erasure correction capability of the second ECC scheme 154, may be attempted for each stripe. Because portions of failed codewords may be error-free, one or more of the trial versions of each of the stripes may be decodable (if a total number of erroneous symbols in the stripe is less than or equal to Z). An example of a method of stripe decoding using different combinations of failed codewords is described with reference to FIG. 3.

A determination is made as to whether any of the trial codewords for the $k^{th}$ stripe are decodable, at 234. For example, one or more trial versions of the first stripe codeword 191 may be provided to the ECC engine 136 to attempt a decoding operation at the stripe decoder 156, at 234. A determination is made, at 236, as to whether all stripes of the data structure 110 have been processed (i.e., if k equals the number of stripes (K) in the data structure 110). If any stripes have not been processed, then the loop counter k is incremented, at 238, and processing returns to generating the codeword for the next stripe, at 232. Otherwise, processing returns to 203 to determine whether the codeword n is decodable, at 203.

By first attempting decoding of each of the codewords and next attempting decoding of each stripe, individual sections of the various codewords may be error corrected. For example, correction of errors in a stripe may improve the likelihood of decoding success for one or more of the codewords 160-162. Likewise, successful decoding of one of the codewords 160-162 further increases the probability of successful decoding of one or more of the stripes of the data structure 110. Iteratively alternating between decoding columns (e.g., stripes) and decoding rows (e.g., codewords) of the data structure 110 enables correction of errors in one or more of the columns to increase a likelihood that one or more of the rows will become decodable. Similarly, correction of errors in one or more of the rows increases a likelihood that one or more of the columns will become decodable. Iteratively alternating between decoding columns (e.g., stripes) and decoding rows (e.g., codewords) of the data structure 110 can result in correction of a sufficient number of bits in the $n^{th}$ codeword to enable decoding of the $n^{th}$ codeword and sending of an error corrected version of the requested data to the access device 170 of FIG. 1.

Figure 3:
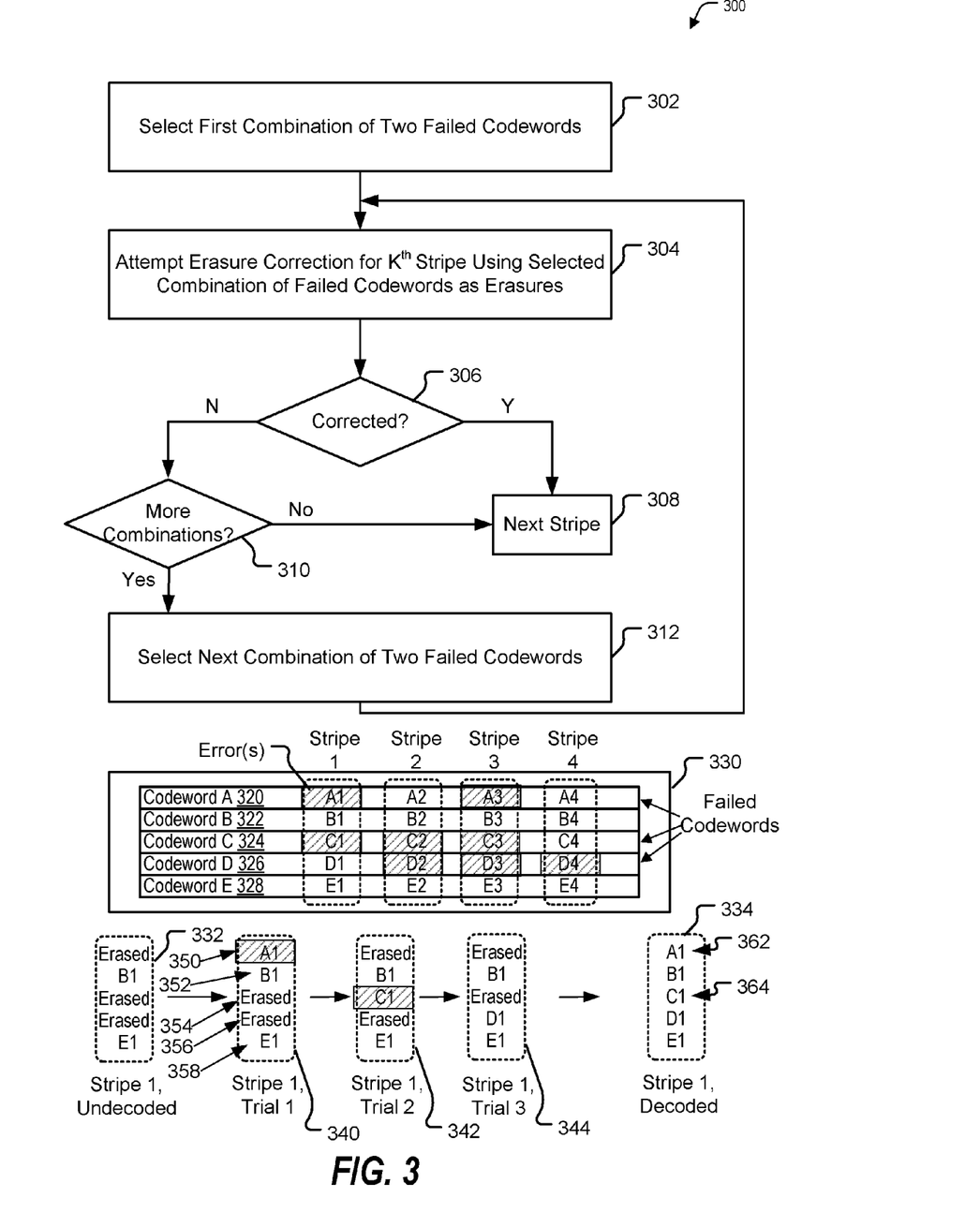
FIG. 3 is a flow diagram of a particular example of a method of encoding data that may be performed by the data storage device of FIG. 1.

Referring to FIG. 3, a particular illustrative example of a method of stripe decoding using different combinations of failed codewords is depicted and generally designated 300. The method 300 may be performed at a data storage device, such as at the data storage device 102 of FIG. 1. One or more operations of the method 200 may be performed or initiated by the controller 130, such as in response to a data write request from the access device 170 of FIG. 1. As an example, the method 300 may be performed during generation of trial codewords and attempting erasure correction of the trial codewords at 232-234 of the method 200 of FIG. 2.

The method 300 includes selecting a first combination of two failed codewords, at 302. An erasure correction for the $k^{th}$ stripe is attempted using the selected combination of failed codewords as erasures, at 304. For example, the stripe generator 190 of FIG. 1 may track the number "Y" of failed codewords of the data structure 110 that are "undecodable" by the ECC decoder 154 (e.g., by having a number of bit errors that exceeds an error correction capability of the ECC decoder 154). The stripe generator 190 may select Z of the Y failed codewords as corresponding to erased data and may designate the remaining (Z-Y) failed codewords as corresponding to valid data. The resulting trial stripe data generated by the stripe generator 190 may be provided to the stripe decoder 156 for decoding.

To illustrate, an example data structure 330 includes five codewords and four stripes. Codeword A includes data errors at portions A1 and A3, rendering codeword A undecodable at the ECC decoder 154. Codeword B is error-free. Codeword C includes data errors at portions C1, C2, and C3. Codeword D includes data error at portions D2, D3 and D4. Codeword E is error-free. Because codewords A, C, and D have more errors than an error correction capacity of the ECC decoder 154, codewords A, C, and D are failed codewords. Thus, the number of failed codewords (Y=3) may exceed the erasure correction capacity of the stripe decoder 156 (Z=2). For example, designating elements of the first stripe 332 that correspond to failed codewords (e.g., elements A1, C1, and D1) as erased data cause the first stripe 332 to be undecodable by the stripe decoder 156.

The stripe generator 190 may generate a first trial version of the first stripe by selecting failed codeword A as contributing valid data (e.g., as if A1 is error-free) and designating codewords C and D as erasures to generate first trial data 340. The first trial data 340 includes an element 350 that is associated with codeword A 320, an element 352 that is associated with codeword B 322, an element 354 that is associated with codeword C 324, an element 356 that is associated with codeword D 326, and an element 358 that is associated with codeword E 328. The first trial data 340 includes at least one element that corresponds to erased data and at least another element that is associated with a failed codeword and that corresponds to valid data of the stripe. To illustrate, elements 354 and 356 correspond to erased data, and element 350 is associated with a failed codeword (codeword A 320) but corresponds to valid (e.g., non-erased, as if A1 is error-free) data of the stripe. The stripe generator 190 may generate a second trial version of the first stripe by selecting failed codeword C as contributing valid data (e.g., as if C1 is error-free) and designating codewords A and D as erasures to generate second trial data 342. The stripe generator 190 may generate a third trial version of the first stripe by selecting failed codeword D as contributing valid data (e.g., as if D1 is error-free) and designating codewords A and C as erasures to generate third trial data 344.

Because the first trial data 340 includes one or more errors in non-erased data (in A1) and the second trial data 342 also includes one or more errors in non-erased data (in C1), decoding of the first trial data 340 and the second trial data 342 fails at the stripe decoder 156. However, because the third trial data 344 has no errors in non-erased data, the third trial data (and therefore the first stripe) is decodable at the stripe decoder 156. The elements of the decoded stripe 1 334 are error-free, including an error-corrected version of the portion A1 362 and an error-corrected version of the portion C2. Codewords A and C may be updated by replacing erroneous portions A1 and C1 with the error-corrected versions 362 and 364, respectively.

The method 300 may include determining whether the trial stripe data was corrected, at 306. If the trial stripe data was corrected, a next stripe is processed, at 308. Otherwise, a determination of whether all distinct combinations of the failed codewords have been tested, at 310. If all distinct combinations of the failed codewords for the $k^{th}$ stripe have been tested (e.g., stripe decoding of each of the trial data 340, 342, and 344 has been attempted), processing advances to the next stripe, at 308. Otherwise, a next combination of two failed codewords is selected, at 312, and a next trial version of the $k^{th}$ stripe is processed at the stripe decoder 156.

By generating trial versions of each of the stripes based on using different combinations of failed codewords, stripes may decoded even though the number of failed codewords (Y) exceeds the erasure correction capacity (Z). For example, stripe 1 can be decoded by designating failed codeword D as corresponding to valid data (portion D1) and failed codewords A and C as corresponding to erasure data (portions A1 and C1). Stripe 2 can be decoded by designating failed codeword A as corresponding to valid data (portion A2) and failed codewords C and D as corresponding to erasure data (portions C2 and D2). Stripe 3 cannot be decoded, and stripe 4 can be decoded via random error correction because the number of erroneous data portions (a single portion D4) is equal to Z/2. As a result, three of the four stripes can be corrected, leaving erroneous data remaining only in stripe 3. Because each of the modified codewords A, C, and D have a single erroneous portion (after updating data portions of the codewords based on the stripe corrections), each of the modified codewords A, C, and D are correctable at the ECC decoder 154.

Although the above example uses 5 codewords, 4 stripes, Y=3, and Z=2, in other implementations any other number of codewords, number of stripes, and erasure correction capability (Z) may be used. For example, iterative information exchange as described with respect to the examples of FIGS. 1-3 may be performed between Reed-Solomon (RS) RAID decoding and LDPC decoding, and the RS RAID may be configured to recover up to Z failing pages (Z=1, 2, 3, or any other number).

In case Y>Z pages have failed LDPC decoding, a joint iterative decoding process between the LDPC and the RS RAID may be performed. For example, a RS decoding operation may be performed that traverses all the RS code stripes in a data structure. For each RS stripe with less than floor(Z/2) erroneous symbols, the errors are corrected by the RS decoder. If the RS decoding fails, then an additional step may be performed by performing up to $$\binom{Y}{Z} = \frac{Y!}{Z!(Y-Z)!}$$

(where "!" indicates the factorial function) RS decoding attempts. In each such decoding attempt a different set of Z symbols out of the Y failing pages will be marked as erased. If the number of erroneous symbols in the RS stripe is less than or equal to Z, then one of these decoding attempts will succeed.

Once the "horizontal" RS decoding operation has performed the above decoding procedure on all the RS stripes, one or more of the RS stripes may have decoded successfully. In this case, the overall BER observed by the LDPC codes is reduced. Then a next "vertical" decoding operation may be initiated to traverse all the pages (e.g., rows of the data structure 110 or 330) and performing LDPC decoding.

Once the vertical LDPC decoding operation has completed, one or more of the LDPC decodings may have reduced the BER. In this case, a next horizontal RS decoding operation may be performed. This iterative process between the horizontal RS operations and the vertical LDPC operations may continue as long as BER is reduced in each step up to full convergence and decoding of all the data pages.

Figure 4:
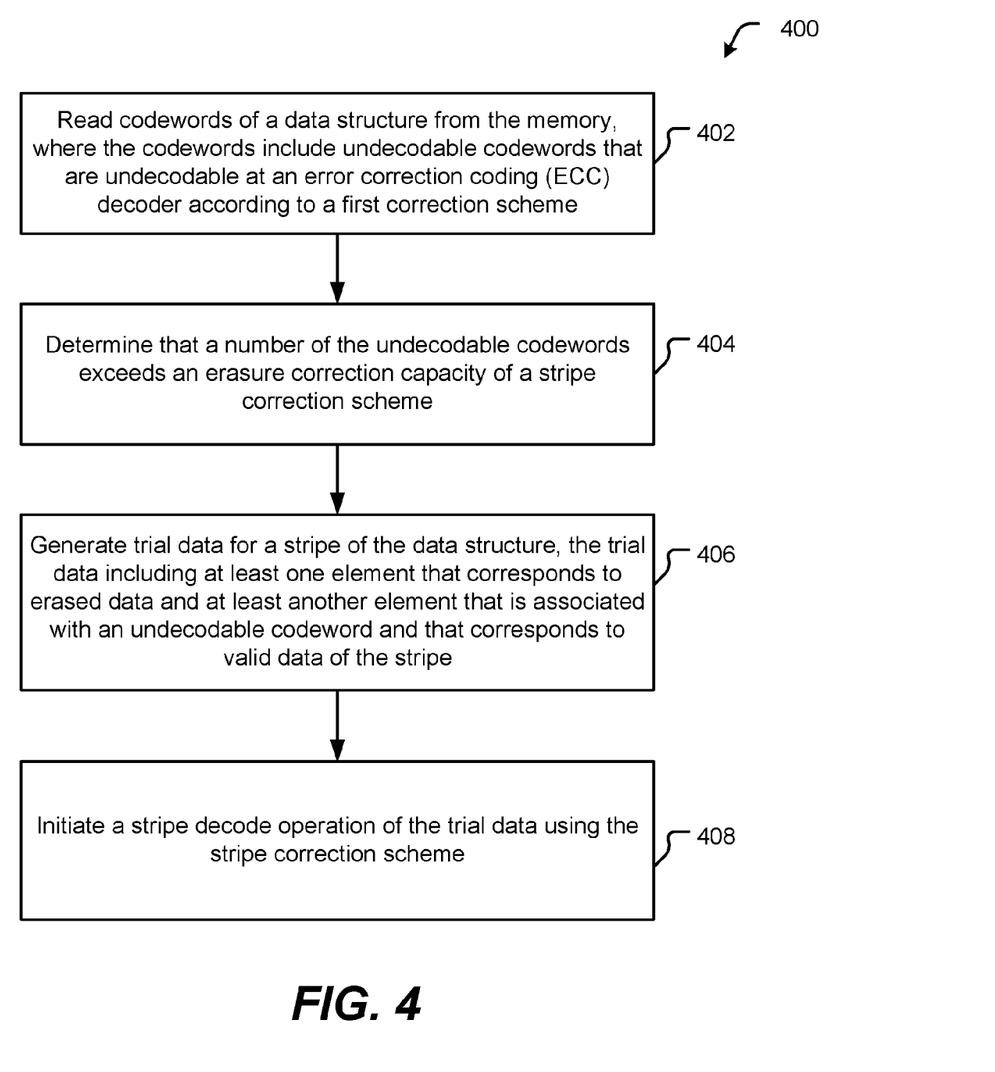
FIG. 4 is a flow diagram of another particular example of a method of decoding data that may be performed by the data storage device of FIG. 1.

Referring to FIG. 4, a particular illustrative example of a method of encoding data is depicted and generally designated 400. The method 400 may be performed at a data storage device, such as at the data storage device 102 of FIG. 1. One or more operations of the method 400 may be performed or initiated by the controller 130, such as in response to a data write request from the access device 170 of FIG. 1.

The method 400 includes reading codewords of a data structure from the memory, at 402. For example, the controller 130 of FIG. 1 may read codewords of the data structure 110 from the memory 104, as described with reference to FIG. 1. To illustrate, the controller 130 may route a representation of one or more of the codewords 160-166 to the ECC engine 136. The codewords 160-166 may include undecodable codewords that are undecodable at the ECC decoder 154 according to the first correction scheme 150, as described with reference to FIG. 1. At least one of the codewords (e.g., the first parity codeword 164, the second parity codeword 166, or both) may include parity data for multiple stripes (e.g., the first stripe 197 and the second stripe 199) of the data structure 110. In a particular aspect, the controller 130 of FIG. 1 may read the codewords in response to receiving a request for data from the access device 170. The data may be encoded in a particular codeword (e.g., the first codeword 160) of the undecodable codewords.

The method 400 also includes determining that a number of the undecodable codewords exceeds an erasure correction capacity of a stripe correction scheme, at 404. For example, the stripe generator 190 of FIG. 1 may determine that a number of the undecodable codewords exceeds an erasure correction capacity of the second correction scheme 152, as described with reference to FIG. 1.

The method 400 further includes generating trial data for a stripe of the data structure, at 406. The trial data includes at least one element that corresponds to erased data and at least another element that is associated with an undecodable codeword and that corresponds to valid data of the stripe. For example, the first trial data 340 of FIG. 3 includes elements 354 and 356 that correspond to erased data and at least another element (element 350) that is associated with a failed codeword (codeword A 320) and corresponds to valid (e.g., non-erased, as if A1 is error-free) data of the stripe. As another example, the stripe generator 190 of FIG. 1 may generate trial data for the first stripe 197 of the data structure 110 such that at least one of the undecodable codewords (e.g., the first codeword 160) corresponds to erased data (e.g., the first portion 171) of the first stripe 197 and at least another of the undecodable codewords (e.g., the $S^{th}$ codeword 162) corresponds to valid data (e.g., the first portion 173) of the first stripe 197, as described with reference to FIG. 1. Generating the trial data may include grouping the first portion 171 and a first portion of one or more other codewords, including the first portion 173 of the $S^{th}$ codeword 162 to form the first stripe codeword 191, as described with reference to FIG. 1. The stripe generator 190 may select a second number of the undecodable codewords to correspond to the erased data and may designate the first portion from the selected codewords as being erased, as described with reference to FIG. 1. The second number may equal the erasure correction capacity of the second correction scheme 152.

The method 400 also includes initiating a stripe decode operation of the trial data using the stripe correction scheme, at 408. For example, the stripe decoder 156 of FIG. 1 may initiate a stripe decode operation of the trial data using the second correction scheme 152, as described with reference to FIG. 1.

The ECC decoder 154 may alternate between codeword processing using the first correction scheme 150 and stripe processing using the second correction scheme 152. Such alternating between codeword processing and stripe processing may continue until the particular codeword (e.g., the first codeword 160) is decoded, as described with reference to FIG. 1. The first correction scheme 150 may include a LDPC scheme, and the second correction scheme 152 may include the Reed-Solomon scheme. The ECC decoder 154 may, for each undecoded stripe (e.g., the first stripe 197) of the data structure 110, test different combinations of the undecodable codewords as erased data until the stripe (e.g., the first stripe 197) is decoded or until all distinct combinations of the undecodable codewords as erased data have been tested.

The ECC decoder 154 may, in response to at least one stripe (e.g., the first stripe 197) being undecodable after decode processing of the stripes (e.g., the first stripe 197 and the second stripe 199) of the codeword (e.g., the first codeword 160), initiate a decode operation of a modified version of a first undecoded codeword (e.g., the first codeword 160) of the undecoded codewords according to the first correction scheme 150. The modified version may include an error-corrected version of a portion (e.g., the first portion 171 or the second portion 181) of the first undecoded codeword (e.g., the first codeword 160), as described with reference to FIG. 1. For example, the decoded stripe 1 334 of FIG. 3 includes an error-corrected version 362 of the first portion (A1) of codeword A 320. A modified version of codeword A 320 may include the error-corrected version 362 of the first portion (A1).

Although the controller 130 and certain other components described herein are illustrated as block components and described in general terms, such components may include one or more microprocessors, state machines, and/or other circuits configured to enable the data storage device 102 (or one or more components thereof) to perform operations described herein. Components described herein may be operationally coupled to one another using one or more nodes, one or more buses (e.g., data buses and/or control buses), one or more other structures, or a combination thereof. One or more components described herein may include one or more physical components, such as hardware controllers, state machines, logic circuits, one or more other structures, or a combination thereof, to enable the data storage device 102 to perform one or more operations described herein.

Alternatively or in addition, one or more aspects of the data storage device 102 may be implemented using a microprocessor or microcontroller programmed (e.g., by executing instructions) to perform one or more operations described herein, such as one or more operations of the methods 200-400. In a particular embodiment, the data storage device 102 includes a processor executing instructions (e.g., firmware) retrieved from the memory device 103. Alternatively or in addition, instructions that are executed by the processor may be retrieved from memory separate from the memory device 103, such as at a read-only memory (ROM) that is external to the memory device 103.

It should be appreciated that one or more operations described herein as being performed by the controller 130 may be performed at the memory device 103. As an illustrative example, in-memory ECC operations (e.g., encoding operations and/or decoding operations) may be performed at the memory device 103 alternatively or in addition to performing such operations at the controller 130.

To further illustrate, the data storage device 102 may be configured to be coupled to the access device 170 as embedded memory, such as in connection with an embedded MultiMedia Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The memory device 103 may include a three-dimensional (3D) memory, such as a resistive random access memory (ReRAM), a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), or a combination thereof. Alternatively or in addition, the memory device 103 may include another type of memory. In a particular embodiment, the data storage device 102 is indirectly coupled to an access device (e.g., the access device 170) via a network. For example, the data storage device 102 may be a network-attached storage (NAS) device or a component (e.g., a solid-state drive (SSD) component) of a data center storage system, an enterprise storage system, or a storage area network. The memory device 103 may include a semiconductor memory device.

Semiconductor memory devices include volatile memory devices, such as dynamic random access memory ("DRAM") or static random access memory ("SRAM") devices, non-volatile memory devices, such as resistive random access memory ("ReRAM"), magnetoresistive random access memory ("MRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional exemplary structures described but cover all relevant memory structures within the spirit and scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A device comprising:
    a memory; and
    a controller configured to read codewords of a data structure from the memory, wherein the codewords include a number of undecodable codewords that are undecodable at an error correction coding (ECC) decoder according to a first correction scheme, the controller including:
        a stripe generator configured to generate trial data for a stripe of the data structure in response to the number of undecodable codewords exceeding an erasure correction capacity of a stripe correction scheme, the trial data including at least one element that corresponds to erased data and at least another element that is associated with an undecodable codeword and that corresponds to valid data of the stripe; and
        a stripe decoder configured to initiate a stripe decode operation of the trial data.

2. The device of claim 1, wherein
    the stripe generator is further configured to:
    group first portions of each of the codewords to form a stripe codeword; and
    select a second number of the undecodable codewords to correspond to the erased data.

3. The device of claim 2, wherein the second number matches the erasure correction capacity of the stripe correction scheme.

4. The device of claim 1, wherein the controller is further configured to test different combinations of the undecodable codewords as erased data until the stripe is decoded or until all distinct combinations of the undecodable codewords as erased data have been tested.

5. The device of claim 4, wherein the controller is further configured to, in response to at least one stripe being undecodable after decode processing of each stripe of the data structure, initiate a decode operation of a modified version of a first undecodable codeword of the undecodable codewords according to the first correction scheme, the modified version including an error-corrected version of a portion of the first undecodable codeword.

6. The device of claim 1, wherein the controller is further configured to alternate between codeword processing using the first correction scheme and stripe processing using the stripe correction scheme.

7. The device of claim 1, wherein the first correction scheme includes a low density parity check (LDPC) scheme, and wherein the stripe correction scheme includes a Reed-Solomon scheme.

8. The device of claim 1, wherein at least one of the codewords includes parity data for multiple stripes of the data structure.

9. A data storage device comprising:
    means for storing data in a memory; and
    means for controlling operations and configured to read data of a data structure from the memory, the data structure including codewords encoded according to a first error correction coding (ECC) scheme and stripes of the codewords encoded according to an erasure coding scheme, to generate trial data for a stripe of the data structure in response to a number of undecodable codewords of the data structure exceeding an erasure correction capacity of the erasure coding scheme, the trial data generated by including a portion of at least one of the undecodable codewords, and to initiate a stripe decode operation of the trial data.

10. The data storage device of claim 9, wherein:
    the first ECC scheme includes a low density parity check (LDPC) scheme, and
    the erasure coding scheme includes a Reed-Solomon scheme.

11. The data storage device of claim 9, wherein the means for controlling is configured to, for each undecoded stripe of the data structure, test sets of trial data that include different combinations of the undecodable codewords until the stripe is decoded or until all distinct combinations of the undecodable codewords have been tested.

12. The data storage device of claim 9, wherein the memory includes a flash memory.

13. A method comprising:
    reading, by a controller, codewords of a data structure from a memory, wherein the codewords include a number of undecodable codewords that are undecodable at an error correction coding (ECC) decoder according to a first correction scheme;
    generating, by the controller, trial data for a stripe of the data structure in response to determining that the number of undecodable codewords exceeds an erasure correction capacity of a stripe correction scheme, the trial data including at least one element that corresponds to erased data and at least another element that is associated with an undecodable codeword and that corresponds to valid data of the stripe; and
    initiating, by the controller a stripe decode operation of the trial data using the stripe correction scheme.

14. The method of claim 13, wherein generating the trial data includes:
    grouping first portions of the codewords to form a stripe codeword; and
    selecting a second number of the undecodable codewords to correspond to the erased data.

15. The method of claim 14, wherein the second number equals the erasure correction capacity of the stripe correction scheme.

16. The method of claim 13, further comprising testing different combinations of the undecodable codewords as erased data until the stripe is decoded or until all distinct combinations of the undecodable codewords as erased data have been tested.

17. The method of claim 16, further comprising, in response to at least one stripe being undecodable after decode processing of each stripe of the data structure, initiating a decode operation of a modified version of a first undecodable codeword of the undecodable codewords according to the first correction scheme, the modified version including an error-corrected version of a portion of the first undecodable codeword.

18. The method of claim 13, further comprising:
receiving a request for data, wherein the data is encoded in a particular codeword of the undecodable codewords; and
alternating between codeword processing using the first correction scheme and stripe processing using the stripe correction scheme.

19. The method of claim 13, wherein:
the first correction scheme includes a low density parity check (LDPC) scheme, and
the stripe correction scheme includes a Reed-Solomon scheme.

20. The method of claim 13, wherein at least one of the codewords includes parity data for multiple stripes of the data structure.

* * * * *